United States Patent
Kim et al.

(10) Patent No.: US 11,233,494 B2
(45) Date of Patent: Jan. 25, 2022

(54) ELECTRONIC CIRCUIT FOR FILTERING SIGNAL RECEIVED FROM PLASMA CHAMBER

(71) Applicant: SAMSUNG ELECTRONICS CO., LTD., Suwon-si (KR)

(72) Inventors: Hyungjoon Kim, Hwaseong-si (KR); Je-Dong Lee, Hwaseong-si (KR); Younghoon Kwon, Hwaseong-si (KR); Myoungwoon Kim, Suwon-si (KR); Il-Woo Kim, Hwaseong-si (KR); Jiwoon Im, Hwaseong-si (KR); Jaewon Jung, Hwaseong-si (KR); Hee Jong Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

(21) Appl. No.: 16/593,376

(22) Filed: Oct. 4, 2019

(65) Prior Publication Data

US 2020/0204143 A1 Jun. 25, 2020

(30) Foreign Application Priority Data

Dec. 21, 2018 (KR) .......................... 10-2018-0166928

(51) Int. Cl.
*H03H 7/01* (2006.01)
*H01J 37/32* (2006.01)

(52) U.S. Cl.
CPC ..... *H03H 7/0161* (2013.01); *H01J 37/32091* (2013.01); *H01J 37/32165* (2013.01); *H01J 37/32577* (2013.01); *H03H 7/0115* (2013.01)

(58) Field of Classification Search
CPC ............. H01J 37/32091; H03H 7/0115; H03H 7/0161
USPC ............................................... 333/99 PL, 175
See application file for complete search history.

(56) References Cited

U.S. PATENT DOCUMENTS

| 5,187,457 A * | 2/1993 | Chawla ............. H01J 37/32082 333/170 |
| 7,957,706 B2 | 6/2011 | Onno et al. |
| 9,197,188 B2 | 11/2015 | Raieszadeh et al. |
| 9,870,855 B2 | 1/2018 | Leipold et al. |
| 10,074,519 B2 | 9/2018 | Ito et al. |
| 2011/0209995 A1 * | 9/2011 | Rasheed ............. H01J 37/3444 204/298.08 |

(Continued)

FOREIGN PATENT DOCUMENTS

| JP | 56-53592 A | 5/1981 |
| JP | 5993389 B2 | 9/2016 |
| KR | 10-2005-0078537 A | 8/2005 |

(Continued)

*Primary Examiner* — Rakesh B Patel
(74) *Attorney, Agent, or Firm* — Lee IP Law, PC

(57) ABSTRACT

An electronic circuit includes a first filter and a second filter. The first filter passes a first frequency component of a first harmonic frequency generated by a first voltage source to form a potential difference in a chamber and a second frequency component of a second harmonic frequency higher than the first harmonic frequency. The second filter removes the first frequency component and the second frequency component received from the first filter. The second harmonic frequency is included in a first frequency band determined based on a capacitance of the second filter.

20 Claims, 9 Drawing Sheets

(56) References Cited

U.S. PATENT DOCUMENTS

2018/0025930 A1   1/2018   Augustyniak et al.

FOREIGN PATENT DOCUMENTS

KR       10-0775559  B1    11/2007
KR    10-2015-0054767 A     5/2015

* cited by examiner

ELECTRONIC CIRCUIT FOR FILTERING SIGNAL RECEIVED FROM PLASMA CHAMBER

CROSS-REFERENCE TO RELATED APPLICATION

Korean Patent Application No. 10-2018-0166928, filed on Dec. 21, 2018, in the Korean Intellectual Property Office, and entitled: "Electronic Circuit for Filtering Signal Received from Plasma Chamber," is incorporated by reference herein in its entirety.

BACKGROUND

1. Field

Embodiments described herein relate to an electronic circuit and, more particularly, relate to an electronic circuit for filtering a signal received from a plasma chamber in semiconductor manufacturing devices.

2. Description of the Related Art

As mobile devices develop, sizes of semiconductor elements therein are decreasing. To manufacture semiconductor elements having a reduced size, the precision of a semiconductor manufacturing process is increasing. Technologies for reducing a process error occurring in the semiconductor manufacturing process are being developed to manufacture a semiconductor chip accurately.

Plasma is used in a manufacturing process of various industrial fields. When gas absorbs a lot of energy under an appropriate environment (e.g., a high-temperature and a high-pressure environment), the gas may be divided into an electron having a negative charge and a positive ion having a positive charge. Reactivity of a material may increase in an environment including a gas of a plasma state. Accordingly, plasma may be variously applied in a semiconductor process.

A low-temperature plasma may be mainly used in the semiconductor processes. The low-temperature plasma may be generated by a high-frequency voltage. When a plasma state changes due to an ambient environment, a process error may occur.

SUMMARY

According to an example embodiment, an electronic circuit may include a first filter and a second filter. The first filter may pass a first frequency component of a first harmonic frequency generated by a first voltage source configured to form a potential difference in a chamber and a second frequency component of a second harmonic frequency higher than the first harmonic frequency. The second filter may remove the first frequency component and the second frequency component received from the first filter. The second harmonic frequency may be included in a first frequency band determined based on a capacitance of the second filter.

According to an example embodiment, an electronic circuit may a first capacitive element configured to pass a first frequency component of a first harmonic frequency and a second frequency component of a second harmonic frequency, the first frequency component being generated based on a first voltage applied to a chamber, the second harmonic frequency being higher than the first harmonic frequency, an inductive element connected in series with the first capacitive element to remove the first frequency component received through the first capacitive element, and a second capacitive element connected in parallel with the inductive element to remove the second frequency component received through the first capacitive element.

According to an example embodiment, an electronic circuit may include an inductive element to pass a first frequency component of a first harmonic frequency and a second frequency component of a second harmonic frequency, the first harmonic frequency being generated based on a first voltage applied to a chamber, the second harmonic frequency being higher than the first harmonic frequency, a first capacitive element connected in series with the inductive element to remove the first frequency component received through the inductive element, and a second capacitive element connected in parallel with the inductive element to pass the second frequency component to the first capacitive.

BRIEF DESCRIPTION OF THE DRAWINGS

Features will become apparent to those of skill in the art by describing in detail exemplary embodiments with reference to the attached drawings in which.

DETAILED DESCRIPTION

In the specification, one capacitive element is illustrated as one element, but the capacitive element may be understood as including one or more elements. For example, the capacitive element may include at least one of one or more capacitors connected in series, one or more capacitors connected in parallel, and various combinations of one or more capacitors connected in series and one or more capacitors connected in parallel. Alternatively, the capacitive element may include various active elements and various passive elements having a capacitance.

In the specification, one inductive element is illustrated as one element, but the inductive element may be understood as including one or more elements. For example, the inductive element may include at least one of one or more inductors connected in series, one or more inductors connected in parallel, and various combinations of one or more inductors connected in series and one or more inductors connected in parallel. Alternatively, the inductive element may include various active elements and various passive elements having an inductance.

Figure 1:
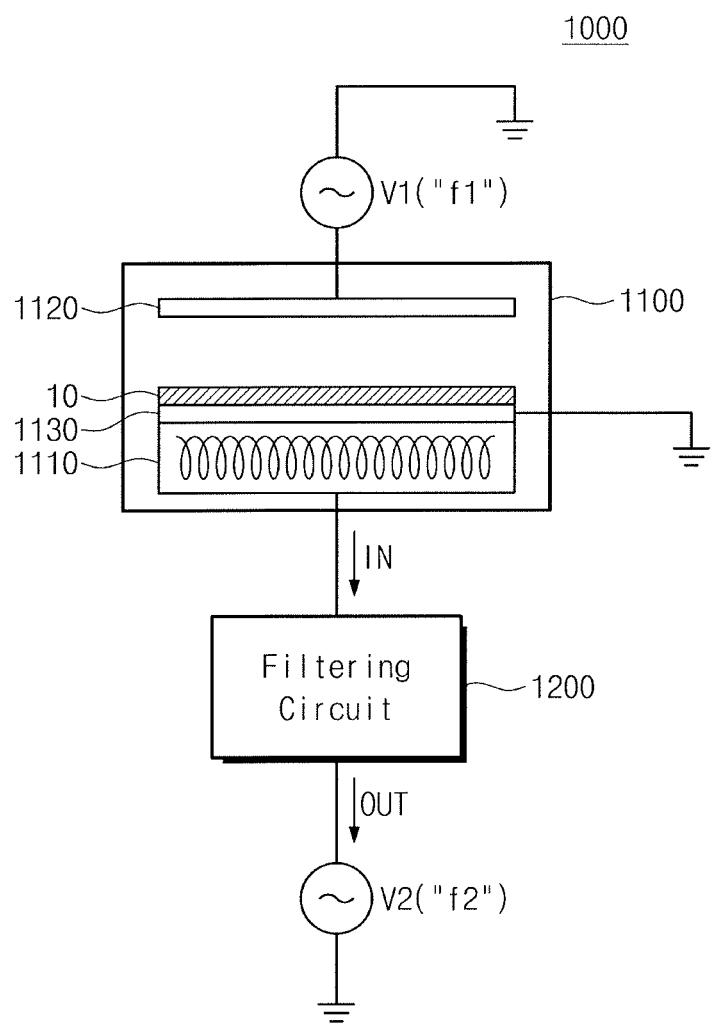
FIG. 1 illustrates a semiconductor manufacturing device according to an embodiment.

FIG. 1 illustrates a semiconductor manufacturing device according to an embodiment. Referring to FIG. 1, a semiconductor manufacturing device 1000 may include a chamber 1100, a filtering circuit 1200, and voltage sources V1 and V2. The voltage source V1 may generate a voltage of frequency "f1", and the voltage source V2 may generate a voltage of frequency "f12". The frequency "f1" may be higher than the frequency "f2". For example, the frequency "f1" may range from hundreds "kHz" to tens "MHz". For example, the frequency "f2" may range from tens "Hz" to hundreds "Hz".

The chamber 1100 may include a heater 1110 and electrodes 1120 and 1130. The voltage source V1 may be connected between a ground terminal and the electrode 1120. The electrode 1130 may be connected with the ground terminal. A wafer 10 that will be used to manufacture a semiconductor chip may be positioned on the electrode 1130. For example, the chamber 1100 may be a plasma chamber for plasma ashing, etching, deposition processes.

The voltage source V2 may supply a voltage to the heater 1110 through the filtering circuit 1200. The heater 1110 may include a coil-shaped circuit. As a voltage is supplied to a coil, a current may flow through the coil. As the current flows through the coil, electrical energy that is transferred by the current and the voltage may be converted to thermal energy. Accordingly, a temperature of the coil may increase. An internal temperature of the chamber 1100 may increase due to the increased temperature of the coil. For example, the internal temperature of the chamber 1100 may increase from an ambient temperature up to 300° C. to 650° C.

A gas (e.g., 02) for a plasma process may be injected into the chamber 1100 of a vacuum state. A potential difference of "V1" may be formed between the electrodes 1120 and 1130 by the voltage source V1. A state of the injected gas may be changed to a plasma state by the potential difference of "V1" formed between the electrodes 1120 and 1130. A substance of the plasma state may be used for various processes to be performed on the wafer 10. For example, a gas of the plasma state may be used to perform the ashing, etching, and deposition processes on the wafer 10.

A current may flow from the electrode 1120 to the electrode 1130 by the substance of the plasma state. The current may flow to the ground terminal through the electrode 1130. A current that fails to flow to the ground terminal connected to the electrode 1130 may flow to the voltage source V2 through the filtering circuit 1200. For example, a signal IN may be transferred from the electrode 1130 to the filtering circuit 1200. The signal IN may include frequency components of a harmonic frequency associated with a voltage of the voltage source V1.

As the signal IN passes through the filtering circuit 1200, a signal OUT may include frequency components of the harmonic frequency. When the frequency components of the harmonic frequency included in the signal OUT are transferred to the voltage source V2, the voltage source V2 may be damaged. When the voltage source V2 is damaged, a characteristic of a voltage that is supplied from the voltage source V2 may change. This may cause an error with regard to a process that is performed in the chamber 1100.

To reduce a damage of the voltage source V2 due to the signal OUT, the filtering circuit 1200 may filter the frequency components included in the signal IN to output the signal OUT. For example, the filtering circuit 1200 may reduce magnitudes of frequency components of the harmonic frequency included in the signal IN.

For example, a harmonic frequency that is generated by the voltage source V1 may be associated with the frequency "f1" of a voltage formed between the electrodes 1120 and 1130 by the voltage source V1. The filtering circuit 1200 may include components for reducing magnitudes of frequency components of a harmonic frequency which may damage the voltage source V2 and the filtering circuit 1200. An example configuration and example operations of the filtering circuit 1200 will be described with reference to FIGS. 2 to 9.

Figure 2:
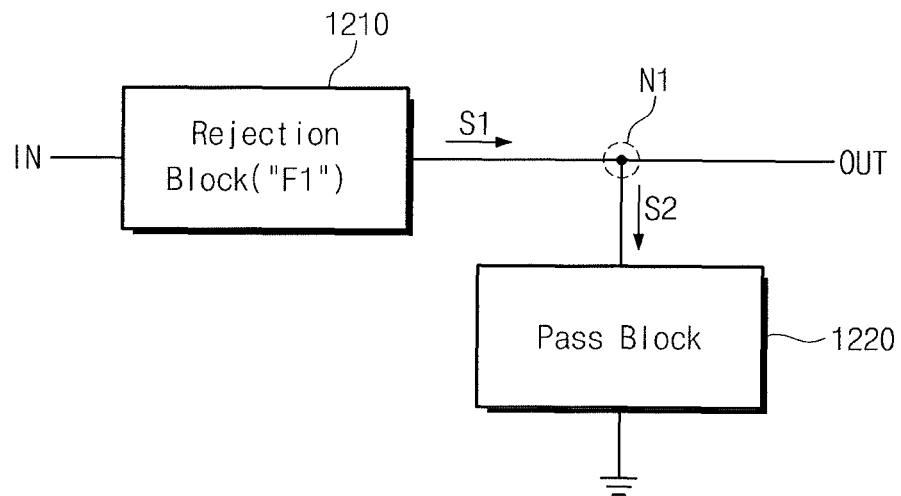
FIG. 2 illustrates an example configuration of a filtering circuit of FIG. 1.

FIG. 2 illustrates an example configuration of a filtering circuit of FIG. 1. Referring to FIG. 2, the filtering circuit 1200 may include a rejection block 1210 and a pass block 1220. The rejection block 1210 may be connected with a node N1. The pass block 1220 may be connected between the node N1 and the ground terminal. The node N1 may be connected with the voltage source V2 of FIG. 1.

Accordingly, a signal generated based on a voltage of the voltage source V2 may be input to the pass block 1220 through the node N1. The ground terminal supplying a ground voltage is illustrated in FIG. 2, but may be replaced with an equipotential terminal for supplying operating voltages of various levels.

The rejection block 1210 may receive the signal IN from the chamber 1100. As described with reference to FIG. 1, the signal IN may include frequency-components generated by the voltage source V1. The rejection block 1210 may filter the frequency components included in the signal IN to pass a signal S1. As used herein, "filtering" means reducing magnitudes of frequency components in a specific frequency band.

In detail, the rejection block 1210 may be configured to reduce magnitudes of frequency components having a first harmonic frequency among frequency components of the signal IN. Accordingly, a magnitude of a frequency component of the first harmonic frequency included in the signal S1 may be smaller than a magnitude of a frequency component of the first harmonic frequency included in the signal IN.

For example, the rejection block 1210 may have cutoff frequencies that are determined by a capacitance and an inductance of the rejection block 1210. A stop band F1 of the rejection block 1210 may be determined by the cutoff frequencies. The rejection block 1210 may be configured to reduce magnitudes of frequency components of the stop band F1. An example configuration of the rejection block 1210 will be described with reference to FIG. 3.

The pass block 1220 may receive a signal S2 from the node N1. The signal S2 may be a signal that is separated from the signal S1. For example, the signal S2 may include a part of frequency components of the signal S1. The pass block 1220 may include components for passing the signal S2 to the ground terminal.

For example, the pass block 1220 may include a band pass filter. The pass block 1220 may filter frequency components included in the signal S1 and may pass a result of the filtering to the ground terminal. In detail, the pass block 1220 may pass the frequency components having the first harmonic frequency among the frequency components of the signal IN.

To pass the frequency components having the first harmonic frequency to the ground terminal efficiently, the pass block 1220 may be designed such that the first harmonic frequency is included in a pass band of a band pass filter. Example configurations of the pass block 1220 will be described with reference to FIGS. 3, 5, 7, and 8.

The signal OUT may be output from the node N1. The signal OUT may be a signal that is separated from the signal S1. For example, the signal OUT may include the remaining frequency components of the frequency components of the signal S other than the frequency components included in the signal S2. As frequency components included in a pass band determined by the pass block 1220 are output to the ground terminal through the pass block 1220, frequency components in the pass band (e.g., the frequency component of a first harmonic frequency) may be removed. That is, a frequency component in a pass band of the pass block 1220 may not be transferred to the voltage source V2.

Accordingly, in the pass band of the pass block 1220, magnitudes of frequency components included in the signal OUT may be smaller than magnitudes of frequency components included in the signal S1. For example, a magnitude of the frequency component of the first harmonic frequency included in the signal OUT may be smaller than a magnitude of the frequency component of the first harmonic frequency included in the signal S1. An example configuration and example operations of the pass block 1220 will be more fully described with reference to FIGS. 3 to 9.

Figure 3:
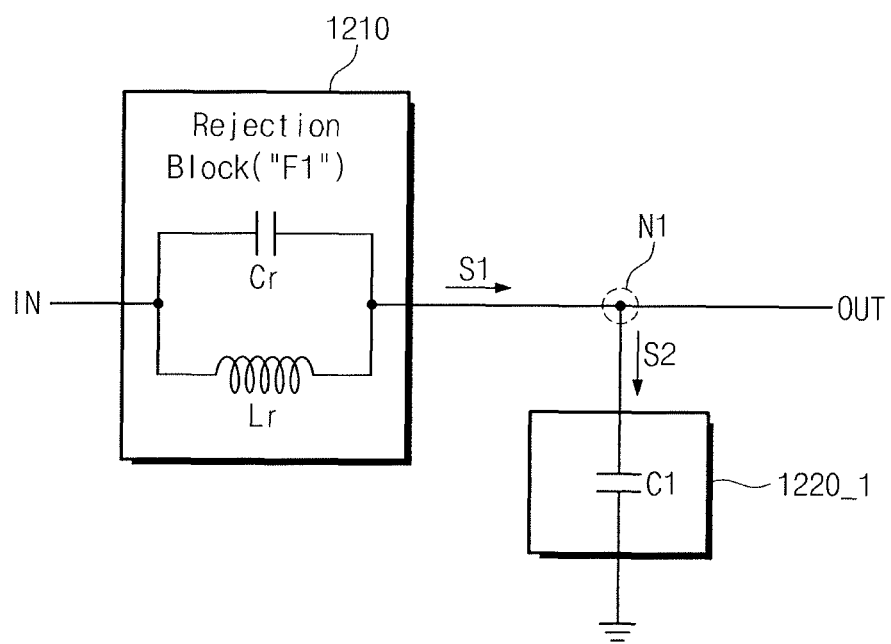
FIG. 3 illustrates an example configuration of a pass block of FIG. 2.

FIG. 3 illustrates an example configuration of a pass block of FIG. 2. As shown in FIG. 3, the pass block 1220 of FIG. 2 may include a pass block 1220_1 of FIG. 3. The pass block 1220_1 may include a capacitive element C1. The capacitive element C1 may be connected between the node N1 and the ground terminal. The pass block 1220_1 including the capacitive element C may operate as a high pass filter.

The rejection block 1210 may include a band stop filter. For example, the rejection block 1210 may include an LC resonant circuit. In the example of FIG. 3, the rejection block 1210 may include a capacitive element Cr and an inductive element Lr connected parallel to the capacitive element Cr. An illustrated in FIG. 3, the rejection block 1210 is composed of the capacitive element Cr and the inductive element Lr, but may be implemented to have various forms of band stop filter configurations.

Cutoff frequencies of the rejection block 1210 may be associated with a capacitance of the capacitive element Cr and an inductance of the inductive element Lr. The capacitance of the capacitive element Cr and the inductance of the inductive element Lr may be determined such that the first harmonic frequency is included in the stop band F1 of the rejection block 1210. For example, the capacitance of the capacitive element Cr and the inductance of the inductive element Lr may be determined such that a center frequency of a band stop filter included in the rejection block 1210 corresponds to the first harmonic frequency.

The pass block 1220_1 may have a cutoff frequency determined by a capacitance of the capacitive element C1. Accordingly, the pass block 1220_1 may have a characteristic of a high pass filter. The pass block 1220_1 may filter frequency components of the signal S2, based on a cutoff frequency. For example, the pass block 1220_1 may reduce magnitudes of frequency components having frequencies that are identical to or lower than the cutoff frequency.

Cutoff frequencies and a pass band of the pass block 1220_1 may be associated with an impedance of the pass block 1220_1. An impedance of the capacitive element C1 may vary with a frequency of the signal S2. Accordingly, an impedance of the pass block 1220_1 may vary with a frequency of the signal S2.

For example, an impedance of the pass block 1220_1 associated with a frequency band of the cutoff frequency or higher may be smaller than an impedance of the pass block 1220_1 associated with a frequency band lower than the cutoff frequency. An example impedance of the pass block 1220_1 according to a frequency of the signal S2 will be more fully described with reference to FIG. 4.

Figure 4:
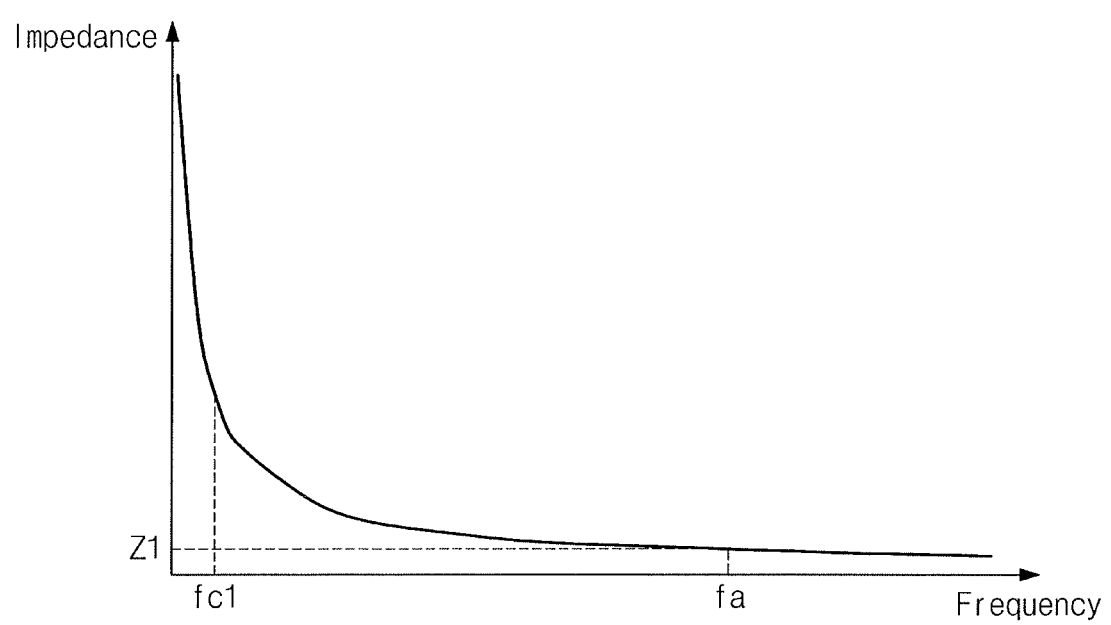
FIG. 4 illustrates a graph of an example impedance of a pass block of FIG. 3.

FIG. 4 illustrates an example impedance of a pass block of FIG. 3. In an example of FIG. 4, an x-axis represents a frequency of the signal S2 and a y-axis represents an impedance of the pass block 1220_1.

The pass block 1220_1 may have a cutoff frequency "fc1" that is determined by a capacitance of the capacitive element C1. An impedance of the pass block 1220_1 in a frequency band (hereinafter referred to as a "pass band") of "fc1" or higher may be smaller than an impedance of the pass block 1220_1 in a frequency band lower than "fc1". Accordingly, in the frequency band lower than the cutoff frequency "fc1", magnitudes of frequency components included in the signal S2 may be reduced by the pass block 1220_1.

The signal S2 may include a frequency component having frequency "fa". The frequency "fa" may be associated with the frequency "f1" of a voltage generated by the voltage source V1. For example, a frequency component of the frequency "fa'" may be a first harmonic frequency generated by the voltage source V1. For example, "fa" may be substantially identical to "f1" or may be a multiple, e.g., an integer multiple, of "f1". The cutoff frequency "fc1'" of the pass block 1220_1 may be lower than the frequency "fa" and the impedance of the cutoff frequency fc1" is greater than an impedance "Z1" of the frequency "fa".

As described with reference to FIG. 3, the pass block 1220_1 may pass frequency components of the first harmonic frequency. Accordingly, the pass block 1220_1 may be designed such that the first harmonic frequency "fa" is included in a pass band. A capacitance of the capacitive element C1 may be determined such that the first harmonic frequency "fa" is included in the pass band (i.e., such that the cutoff frequency "fc1" is lower than the first harmonic frequency "fa").

A magnitude of a frequency component included in the signal S1 may correspond to a sum of a magnitude of a frequency component included in the signal S2 and a magnitude of a frequency component included in the signal OUT. Accordingly, as a magnitude of a frequency component included in the signal S2 increases, a magnitude of a frequency component included in the signal OUT decreases.

As an impedance of the pass block 1220_1 associated with the first harmonic frequency "fa" decreases, a magnitude of a frequency component having the frequency "fa" included in the signal S2 increases. Accordingly, as an impedance of the pass block 1220_1 associated with the first harmonic frequency "fa" becomes decreases, a magnitude of a frequency component having the frequency "fa" included in the signal OUT decreases.

As described with reference to FIG. 1, the voltage source V2 may be damaged by a signal component of the first harmonic frequency "fa" generated by the voltage source V1. Accordingly, as an impedance of the pass block 1220_1 associated with the first harmonic frequency "fa" decreases, damage to the voltage source V2 may decrease.

Figure 5:
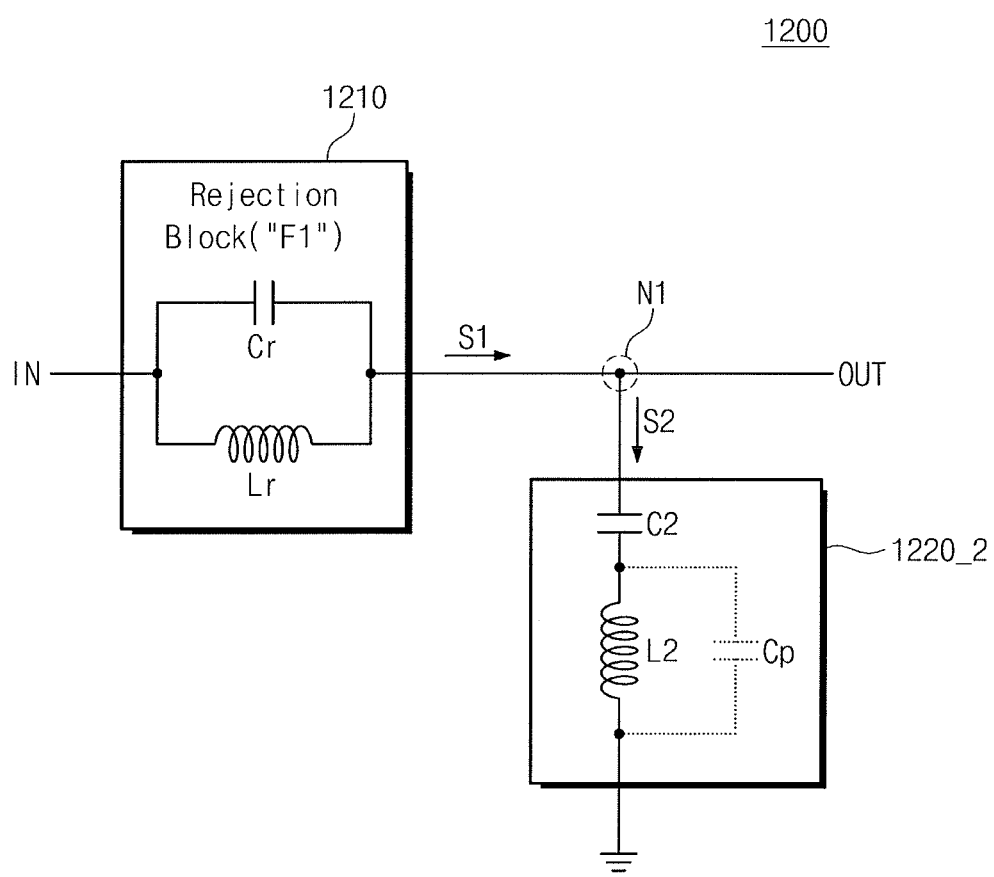
FIG. 5 illustrates an example configuration of a pass block of FIG. 2.

FIG. 5 illustrates an example configuration of a pass block of FIG. 2. The pass block 1220 of FIG. 2 may include a pass block 1220_2 of FIG. 5. The pass block 1220_2 may include a capacitive element C2 and an inductive element L2. The capacitive element C2 may be connected between the node N1 and the inductive element L2. The inductive element L2 may be connected between the capacitive element C2 and the ground terminal. The inductive element L2 may include a parasitic capacitance. For example, the parasitic capacitance of the inductive element L2 may be modeled by a capacitive element Cp connected parallel to the inductive element L2.

The pass block 1220_2 that includes the capacitive element C2 and the inductive element L2 connected in series to the capacitive element C2 may have a characteristic of a band pass filter. The pass block 1220_2 may have cutoff frequencies that are determined by a capacitance of the capacitive element C2 and an inductance of the inductive element L2.

A pass band of the pass block 1220_2 may be determined based on the cutoff frequencies. The pass block 1220_2 may pass frequency components in the pass band to the ground terminal. The pass block 1220_2 may reduce magnitudes of frequency components in a frequency band except for the pass band.

The pass block 1220_2 may have a characteristic of a pass stop filter due to the inductive element L2 and the parasitic capacitance of the inductive element L2. The pass block 1220_2 may have cutoff frequencies determined by an inductance of the inductive element L2 and the parasitic capacitance of the inductive element L2. A stop band of the pass block 1220_2 may be determined based on the cutoff frequencies. The pass block 1220_2 may reduce magnitudes of frequency components in the stop band.

Cutoff frequencies, a pass band, and a stop band of the pass block 1220_2 may be associated with an impedance of the pass block 1220_2. An impedance of the capacitive element C2 and an impedance of the inductive element L2 may vary with a frequency of the signal S2. Accordingly, an impedance of the pass block 1220_2 may vary with a frequency of the signal S2.

An impedance of the pass block 1220_2 associated with the pass band may be smaller than an impedance of the pass block 1220_2 associated with a frequency band except for the pass band. An impedance of the pass block 1220_2 associated with the stop band may be greater than an impedance of the pass block 1220_2 associated with a frequency band except for the stop band. An example impedance of the pass block 1220_2 according to a frequency of the signal S2 will be more fully described with reference to FIG. 6.

Figure 6:
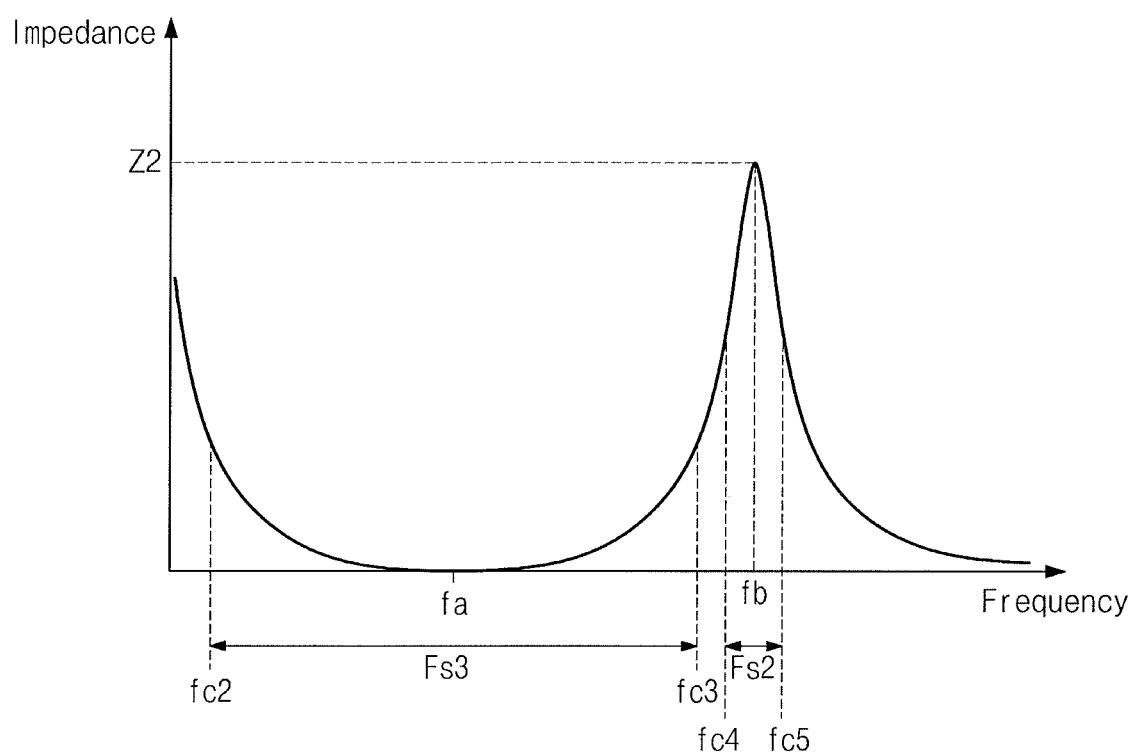
FIG. 6 illustrates a graph of an example impedance of a pass block of FIG. 5.

FIG. 6 illustrates an example impedance of a pass block of FIG. 5. In an example of FIG. 6, an x-axis represents a frequency of the signal S2 and a y-axis represents an impedance of the pass block 1220_2.

The pass block 1220_2 may have cutoff frequencies "fc2" and "fc3" determined by a capacitance of the capacitive element C2 and an inductance of the inductive element L2. An impedance of the pass block 1220_2, corresponding to a pass band Fs3 between the cutoff frequency "fc2" and the cutoff frequency "fc3", may be relatively small.

A capacitance of the capacitive element C2 and an inductance of the inductive element L2 may be determined such that the first harmonic frequency "fa" is included in the pass band Fs1 of the pass block 1220_2. An impedance of the pass block 1220_2 corresponding to the first harmonic frequency "fa" in the pass band Fs1 may be sufficiently small such that most of the first harmonic frequency "fa" is in the signal S2. As described above with reference to FIG. 3, as an impedance of the pass block 1220_2 decreases, damage that the voltage source V2 experiences by a frequency component having the first harmonic frequency "fa" may decrease.

In the example of FIG. 6, an impedance of the pass block 1220_2 corresponding to the first harmonic frequency "fa" may be "0". Accordingly, with regard to frequency components of the signal S2 having the first harmonic frequency "fa", the pass block 1220_2 may connect the node N1 and the ground terminal. A frequency component of the first harmonic frequency "fa" included in the signal S2 may be output to the ground terminal through the pass block 1220_2. Because the frequency component of the first harmonic frequency "fa" passing through the pass block 1220_2 is not transferred to the voltage source V2, the voltage source V2 may not experience a damage coming from the voltage source V1.

The signal S2 may include a frequency component having frequency "fb". The frequency "fb" may be associated with the frequency "f1" of a voltage generated by the voltage source V of FIG. 1. For example, the frequency "fb'" may be a second harmonic frequency generated by the voltage source V1. The second harmonic frequency "fb" may be higher than the first harmonic frequency "fa". For example, "fb" may be "2*fa".

The pass block 1220_2 may have cutoff frequencies "fc4" and "fc5" that are determined by a capacitance of the capacitive element C2 and a parasite inductance of the inductive element L2. A stop band Fs2 of the pass block 1220_2 may be determined based on the cutoff frequencies "fc4" and "fc5". An impedance of the pass block 1220_2 corresponding to the stop band Fs2 may be relatively great. For example, an impedance of the pass block 1220_2 corresponding to the stop band Fs2 may be "Z2".

As the second harmonic frequency "fb" is included in the stop band Fs2, an error may occur upon performing a process. For example, in the case where an impedance of the pass block 1220_2 at the second harmonic frequency "fb" is great, frequency components of "fb" included in the signal S2 may be reflected from the pass block 1220_2 to the electrode 1120 of FIG. 1. An internal environment of the chamber 1100 may have an influence of the reflected frequency components. In the case where the internal environment of the chamber 1100 is not maintained stably, an error may occur upon performing a process on the wafer.

For example, the chamber 1100 may include plasma. The plasma may be greatly affected even by a small noise (e.g., an electrical stimulation, a change of a temperature, a change of a pressure, and the like). For example, a boundary of a plasma sheath that is generated on an inner surface of the chamber 1100 or in the vicinity of a surface of the wafer 10 may move. When an internal environment of the chamber 1100 including the plasma changes, an error may occur upon performing a process.

Figure 7:
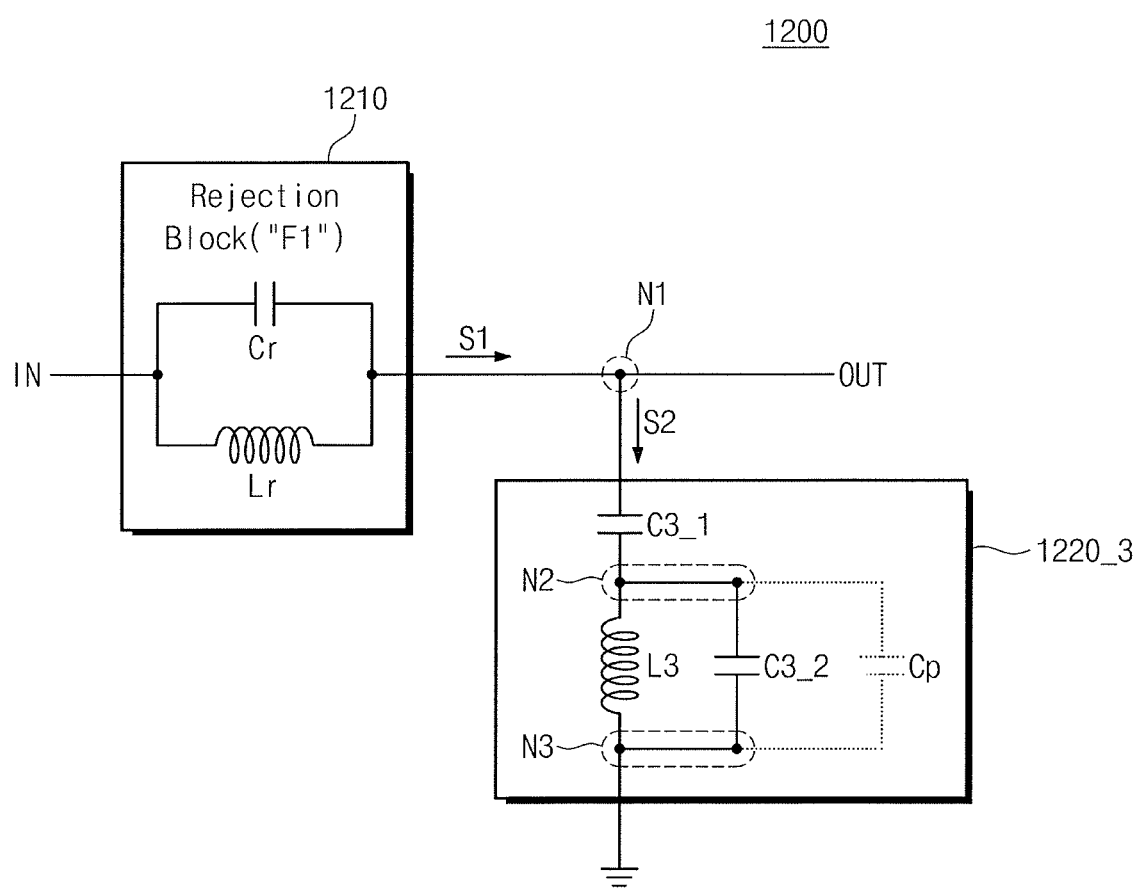
FIG. 7 illustrates an example configuration of a pass block of FIG. 2.

FIG. 7 illustrates an example configuration of a pass block of FIG. 2. The pass block 1220 of FIG. 2 may include a pass block 1220_3 of FIG. 7. The pass block 1220_3 may include capacitive elements C3_1 and C3_2 and an inductive element L3. The capacitive element C3_1 may be connected between the node N1 and a node N2. The inductive element L3 and the capacitive element C3_2 may be connected between the node N2 and a node N3. The node N3 may be connected with the ground terminal. As described above with reference to FIG. 5, the inductive element L3 may have a parasitic capacitance modeled by the capacitive element Cp.

The capacitive element C3_1 and the inductive element L3 connected in series to the capacitive element C3_1 may constitute an LC series resonant circuit. The capacitive element C3_1 and the inductive element L3 may operate as a band pass filter. The pass block 1220_3 may have cutoff frequencies that are determined by a capacitance of the capacitive element C3_1 and an inductance of the inductive element L3. A pass band of the pass block 1220_3 may be determined based on the cutoff frequencies. The pass block 1220_3 may reduce magnitudes of frequency components except for the pass band. The pass block 1220_3 may pass frequency components in the pass band to the ground terminal.

The inductive element L3 and the capacitive elements C3_2 and Cp may constitute an LC parallel resonant circuit. The pass block 1220_3 may operate as a band stop filter by the inductive element L3 and the capacitive elements C3_2 and Cp. The pass block 1220_2 may have cutoff frequencies determined by an inductance of the inductive element L3, a capacitance of the capacitive element C3_2, and the parasitic capacitance of the inductive element L3. A stop band of the pass block 1220_3 may be determined based on the cutoff frequencies. The pass block 1220_3 may reduce magnitudes of frequency components in the stop band.

Cutoff frequencies, a pass band, and a stop band of the pass block 1220_3 may be associated with an impedance of the pass block 1220_3. An impedance of the capacitive elements C3_1 and Cp and an impedance of the inductive element L3 may vary with a frequency of the signal S2. Accordingly, an impedance of the pass block 1220_3 may vary with a frequency of the signal S2. An impedance of the pass block 1220_3 associated with the stop band may be greater than an impedance of the pass block 1220_3 associated with a frequency band except for the stop band. An example impedance of the pass block 1220_3 according to a frequency of the signal S2 will be described with reference to FIG. 9.

Figure 8:
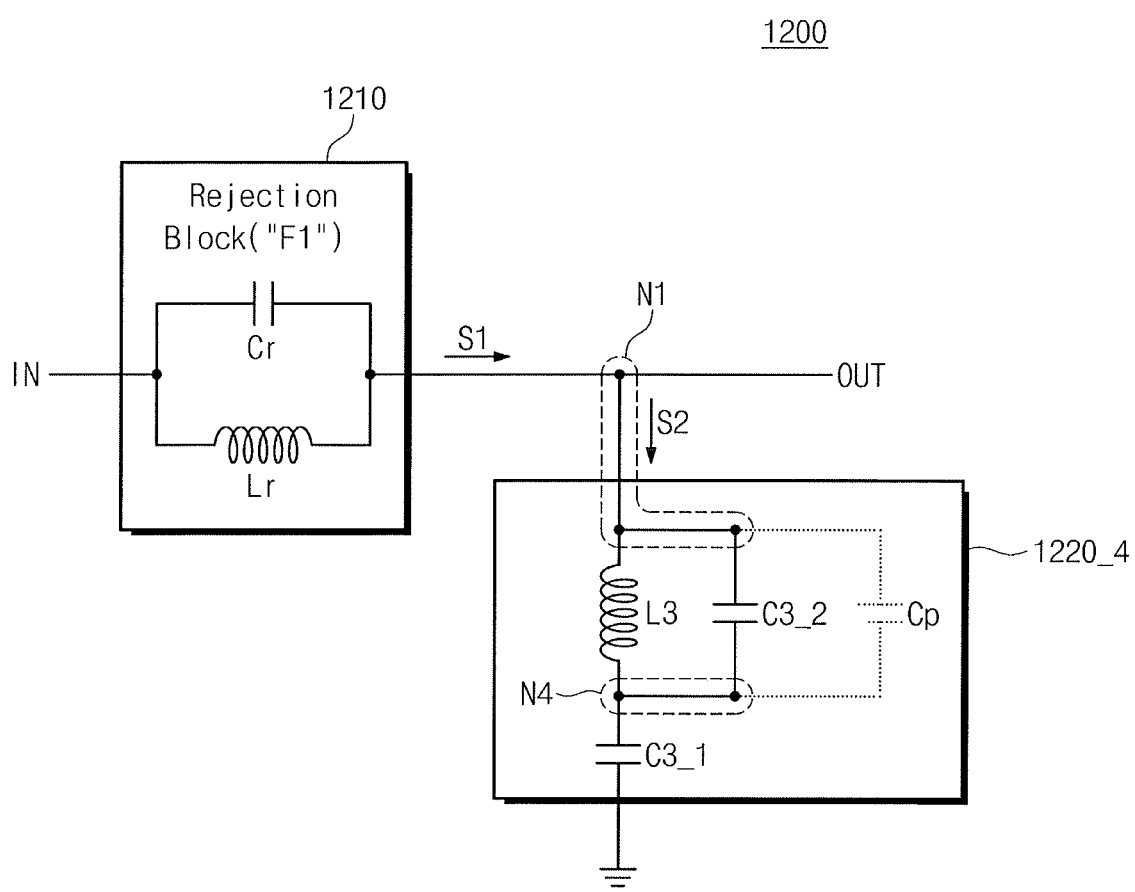
FIG. 8 illustrates an example configuration of a pass block of FIG. 2.

FIG. 8 illustrates an example configuration of a pass block of FIG. 2. The pass block 1220 of FIG. 2 may include a pass block 1220_4 of FIG. 8. The pass block 1220_4 may include the capacitive elements C3_1 and C3_2 and the inductive element L3. The inductive element L3 and the capacitive element C3_2 may be connected between the node N1 and a node N4. The capacitive element C3_1 may be connected between the node N4 and the ground terminal. As described with reference to FIG. 5, the inductive element L3 may have a parasitic capacitance modeled by the capacitive element Cp.

Comparing FIG. 8 with FIG. 7, the pass block 1220_4 may be implemented by changing the placement of the capacitive element C3_1, and the inductive element L3 and the capacitive element C3_2 of the pass block 1220_3. Operations of the pass block 1220_4 of FIG. 8 are similar to the operations of the pass block 1220_3 of FIG. 7, and thus, additional description will be omitted to avoid redundancy. An example impedance of the pass block 1220_4 according to a frequency of the signal S2 will be described with reference to FIG. 9.

Figure 9:
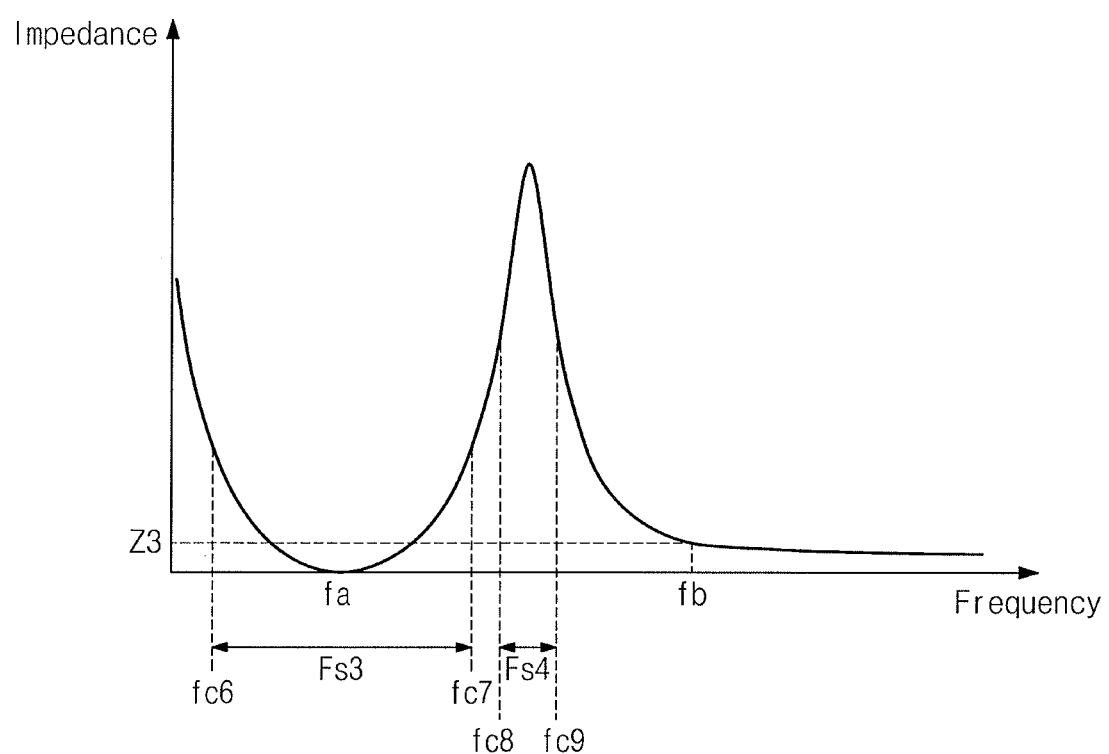
FIG. 9 illustrates a graph of an example impedance of a pass block of FIG. 7 or 8.

FIG. 9 illustrates a graph of an example impedance of a pass block of FIG. 7 or 8. In an example of FIG. 9, an x-axis represents a frequency of the signal S2 and a y-axis represents an impedance of the pass block 1220_3 or 1220_4.

The pass block 1220_3 or 1220_4 may have cutoff frequencies "fc6" and "fc7" determined by a capacitance of the capacitive element C3_1 and an inductance of the inductive element L3. An impedance of the pass block 1220_3 or 1220_4 associated with a pass band Fs3 between the cutoff frequency "fc6" and the cutoff frequency "fc7" may be relatively small.

A capacitance of the capacitive element C3_1 and an inductance of the inductive element L3 may be determined such that the first harmonic frequency "fa" is included in the pass band Fs3 of the pass block 1220_3 or 1220_4. An impedance of the pass block 1220_3 or 1220_4 corresponding to the first harmonic frequency "fa" in the pass band Fs3 may be sufficiently small such that most of the first harmonic frequency "fa" is included in the signal S2. As in the description given with reference to FIG. 3, as an impedance of the pass block 1220_3 or 1220_4 decreases, damage that the voltage source V2 experiences by a frequency component having the first harmonic frequency "fa" may decrease.

In the example of FIG. 9, an impedance of the pass block 1220_3 or 1220_4 associated with the first harmonic frequency "fa" may be "0". Accordingly, with regard to frequency components of the signal S2 having the frequency "fa", the pass block 1220_3 or 1220_4 may connect the node N1 and the ground terminal. A frequency component of the first harmonic frequency "fa" included in the signal S2 may be output to the ground terminal through the pass block 1220_3 or 1220_4. Because the frequency component of the first harmonic frequency "fa" passing through the pass block 1220_3 or 1220_4 is not transferred to the voltage source V2, the voltage source V2 may not experience a damage due to the voltage source V1.

The pass block 1220_3 or 1220_4 may have cutoff frequencies "fc8" and "fc9" that are determined by a capacitance of the capacitive element C3_2, an inductance of the inductive element L3, and a parasitic capacitance of the inductive element L3. A stop band Fs4 may be determined based on the cutoff frequencies "fc8" and "fc9". An impedance of the pass block 1220_3 or 1220_4 corresponding to the stop band Fs4 may be relatively great.

Comparing FIG. 9 with FIG. 6, the stop band Fs4 of the pass block 1220_3 or 1220_4 may be lower than the stop band Fs2 of the pass block 1220_2. For example, a center frequency of the stop band Fs4 may be lower than a center frequency of the stop band Fs2. Stop bands of the pass blocks 1220_2 to 1220_4 may be associated with the capacitive elements Cp connected parallel to the inductive element L2 or capacitances of the capacitive elements C3_2 and Cp connected parallel to the inductive element L3.

For example, the center frequency of the stop band Fs2 of the pass block 1220_2 may be inversely proportional to the root square of the parasitic capacitance "Cp" formed by the inductive element L2. For example, the center frequency of the stop band Fs4 of the pass block 1220_3 or 1220_4 may be inversely proportional to the square root of "Cp+C3_2" being a sum of the parasitic capacitance "Cp" of the inductive element L2 and the capacitance "C3_2" of the capacitive element C3_2.

Because the square root of "Cp+C3_2" is greater than the square root of "Cp", the center frequency of the pass block 1220_3 or 1220_4 may be lower than the center frequency of the pass block 1220_2. Accordingly, the stop band Fs4 of the pass block 1220_3 or 1220_4 may be lower than the stop band Fs2 of the pass block 1220_2.

Accordingly, the second harmonic frequency "fb" generated by the voltage source V1 may not be included in the stop band Fs4 of the pass block 1220_3 or 1220_4. An impedance of the pass block 1220_3 or 1220_4 associated with the frequency "fb" may be "Z3". The impedance Z3 of the pass block 1220_3 or 1220_4 associated with the frequency "fb" may be smaller than the impedance "Z" of the pass block 1220_2 associated with the frequency "fb". Accordingly, a magnitude of a frequency component of the second harmonic frequency "fb" that is reflected by the pass block 1220_3 or 1220_4, e.g., in the output signal OUT, may be small. Accordingly, an error that may occur upon performing a process on the wafer 10 may decrease.

Figure 10:
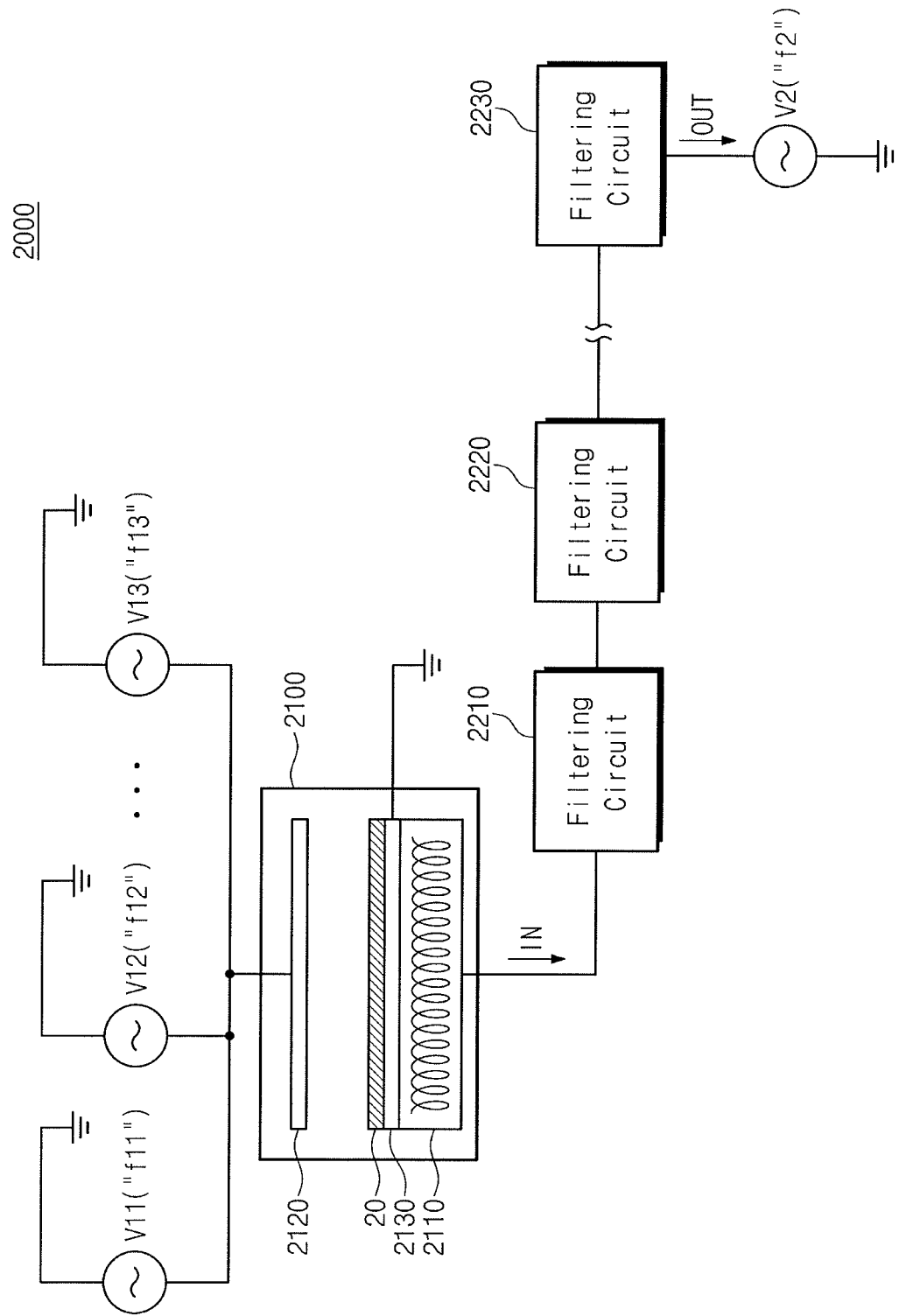
FIG. 10 illustrates a semiconductor manufacturing device according to an embodiment.

FIG. 10 illustrates a semiconductor manufacturing device according to an embodiment. Referring to FIG. 10, a semiconductor manufacturing device 2000 may include a chamber 2100, filtering circuits 2210 to 2230, and voltage sources V11 to V13. A configuration and operations of the chamber 2100 are similar to the configuration and the operations of the chamber 1100, and thus, additional description will be omitted to avoid redundancy. A configuration and operations of the filtering circuits 2210 to 2230 are similar to the configuration and the operations of the filtering circuit 1200, and thus, additional description will be omitted to avoid redundancy.

An example is illustrated in FIG. 10 as the semiconductor manufacturing device 2000 includes three or more voltage sources V11 to V13 and three or more filtering circuits 2210 to 2230, but the number of voltage sources and the number of filtering circuits may be variously changed.

The voltage sources V11 to V13 may generate harmonic frequency components respectively corresponding to frequencies "f11" to "f13". The filtering circuits 2210 to 2230 may filter frequency components generated by the voltage sources V11 to V13. For example, the filtering circuits 2210 to 2230 may be configured to reduce magnitudes of first harmonic frequency components of frequency components generated by the voltage sources V11 to V13.

Accordingly, magnitudes of first harmonic frequency components included in the signal IN input to the filtering circuit 2210 may be greater than magnitudes of first harmonic frequency components included in the signal OUT input to the second voltage source V2. As the first harmonic frequency components are removed by the filtering circuits 2210 to 2230, a damage of the voltage source V2 due to the signal IN received from the voltage sources V11 to V13 may decrease.

Each of the filtering circuits 2210 to 2230 may include a rejection block. The rejection block of each of the filtering circuits 2210 to 2230 may include the rejection block 1210. Each rejection block may be heated by energy transferred through the signal IN. In the case where the rejection blocks are heated, the rejection blocks may be damaged by the thermal energy.

When the rejection blocks are damaged by thermal energy, characteristics of elements included in the rejection blocks may change. When characteristics of the elements included in the rejection blocks change, a characteristic of a signal reflected from the filtering circuits 2210 to 2230 to an electrode 2130 may change. In this case, an internal environment of the chamber 2100 may change, and thus, a process error may occur upon performing a process on a wafer 20.

Each of the filtering circuits 2210 to 2230 may include a pass block. The pass block of each of the filtering circuits 2210 to 2230 may include the pass block 1220_3 to 1220_4. As a first harmonic frequency component generated by the voltage source V1 is output to the ground terminal by the pass blocks, the rejection blocks may not be heated. According to the above description, a damage that the filtering circuits 2210 to 2230 experience may decrease. Accordingly, a process error may decrease upon performing a process on the wafer 20.

According to one or more embodiments, an electronic circuit may reduce magnitudes of signal components having a harmonic frequency by using an LC resonant circuit. Accordingly, a voltage source that is to supply a voltage for an operation of a semiconductor manufacturing device may be prevented from being damaged, a filtering circuit included in the semiconductor manufacturing device may be prevented from being damaged, and an error may decrease when performing a process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electronic circuit, comprising:
a first filter and a second filter coupled together in a filtering circuit, the filtering circuit being configured to receive a signal from a chamber, wherein:
the first filter is configured to pass a first frequency component of a first harmonic frequency and a second frequency component of a second harmonic frequency, the first harmonic frequency being generated by a first voltage source to form a potential difference in the chamber, the second harmonic frequency being higher than the first harmonic frequency,
the second filter is configured to remove the first frequency component and the second frequency component received from the first filter,
the second harmonic frequency is in a first frequency band determined based on a capacitance of the second filter, and
the filtering circuit is coupled to a second voltage source that is supplied to the chamber, the filtering circuit being configured to filter the signal to provide a filtered signal to the second voltage source.

2. The electronic circuit as claimed in claim 1, wherein the second filter is configured to pass the first frequency component and the second frequency component to a ground terminal.

3. The electronic circuit as claimed in claim 1, wherein a magnitude of the first frequency component input to the first filter is greater than a magnitude of the first frequency component output from the first filter.

4. The electronic circuit as claimed in claim 1, wherein:
the first filter is further configured to pass the first frequency component and the second frequency component, which are received through a first node, to a second node, and includes a first inductive element and a first capacitive element connected in parallel between the first node and the second node.

5. The electronic circuit as claimed in claim 4, wherein the first harmonic frequency is included in a second frequency band determined based on an inductance of the first inductive element and a capacitance of the first capacitive element.

6. The electronic circuit as claimed in claim 1, wherein:
the second filter is further configured to receive the first frequency component and the second frequency component through a first node and to output the first frequency component and the second frequency component through a second node, and
wherein the second filter includes a first inductive element and a first capacitive element connected in parallel between the first node and the second node.

7. The electronic circuit as claimed in claim 6, wherein the second filter further includes a second capacitive element connected in series to the first inductive element.

8. The electronic circuit as claimed in claim 7, wherein the first frequency component and the second frequency component pass through the second capacitive element after passing through the first inductive element and the first capacitive element.

9. The electronic circuit as claimed in claim 7, wherein the first frequency component and the second frequency component pass through the first inductive element and the first capacitive element after passing through the second capacitive element.

10. The electronic circuit as claimed in claim 7, wherein the first harmonic frequency is included in a second frequency band determined based on an inductance of the first inductive element and a capacitance of the second capacitive element.

11. The electronic circuit as claimed in claim 7, wherein the second harmonic frequency is included in the first frequency band determined further based on an inductance of the first inductive element.

12. An electronic circuit, comprising:
a first capacitive element configured to pass a first frequency component of a first harmonic frequency and a second frequency component of a second harmonic frequency, the first frequency component being generated based on a first voltage applied to a chamber, the second harmonic frequency being higher than the first harmonic frequency;
an inductive element connected in series with the first capacitive element to remove the first frequency component received through the first capacitive element; and
a second capacitive element connected in parallel with the inductive element to remove the second frequency component received through the first capacitive element.

13. The electronic circuit as claimed in claim 12, wherein the first harmonic frequency and the second harmonic frequency are a multiple of a frequency of the first voltage.

14. The electronic circuit as claimed in claim 12, wherein the first capacitive element is further to receive a signal generated based on a second voltage for an operation of the chamber.

15. The electronic circuit as claimed in claim 14, wherein a magnitude of the first frequency component input to the first capacitive element is greater than a magnitude of the first frequency component received by a second voltage source to supply the second voltage.

16. The electronic circuit as claimed in claim 15, wherein the second voltage is affected by increasing an internal temperature of the chamber.

17. The electronic circuit as claimed in claim 12, wherein the inductive element and the second capacitive element pass the second frequency component to a ground terminal.

18. An electronic circuit, comprising:
an inductive element to pass a first frequency component of a first harmonic frequency and a second frequency component of a second harmonic frequency, the first harmonic frequency being generated based on a first voltage applied to a chamber, the second harmonic frequency being higher than the first harmonic frequency;
a first capacitive element connected in series with the inductive element to remove the first frequency component received through the inductive element; and
a second capacitive element connected in parallel with the inductive element to pass the second frequency component to the first capacitive element.

19. The electronic circuit as claimed in claim 18, wherein:
the inductive element is connected with a second voltage source to supply a second voltage for an operation of the chamber, and
a magnitude of the first frequency component input to the inductive element is greater than a magnitude of the first frequency component received by the second voltage source.

20. The electronic circuit of claim 19, wherein a frequency of the first voltage is higher than a frequency of the second voltage.

* * * * *